(12) United States Patent
Kampe et al.

(10) Patent No.: US 7,126,257 B2
(45) Date of Patent: Oct. 24, 2006

(54) PIEZOELECTRIC CERAMIC-REINFORCED METAL MATRIX COMPOSITES

(75) Inventors: Stephen L. Kampe, Floyd, VA (US); Jeffrey Patrick Schultz, Blacksburg, VA (US); Alexander O. Aning, Blacksburg, VA (US); Adam Goff, Owings Mills, MD (US); Jennifer Franklin, Tijeras, NM (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 41 days.

(21) Appl. No.: 10/851,022

(22) Filed: May 21, 2004

(65) Prior Publication Data

US 2005/0073222 A1 Apr. 7, 2005

Related U.S. Application Data

(60) Provisional application No. 60/472,742, filed on May 23, 2003.

(51) Int. Cl.
*H01L 41/08* (2006.01)
(52) U.S. Cl. ...................................... 310/327
(58) Field of Classification Search ................ 310/358, 310/359; 252/62.9
See application file for complete search history.

(56) References Cited

U.S. PATENT DOCUMENTS

| | | | | |
|---|---|---|---|---|
| 4,944,185 | A | * | 7/1990 | Clark et al. .................... 73/579 |
| 5,132,278 | A | * | 7/1992 | Stevens et al. ............. 505/231 |
| 5,392,982 | A | * | 2/1995 | Li ............................ 228/124.5 |
| 6,228,481 | B1 | * | 5/2001 | Yamada et al. ............. 428/328 |
| 6,261,360 | B1 | * | 7/2001 | Dry ............................. 106/677 |
| 6,527,849 | B1 | * | 3/2003 | Dry ............................. 106/677 |

* cited by examiner

*Primary Examiner*—Mark Budd
(74) *Attorney, Agent, or Firm*—Alan G. Towner, Esq.; Pietragallo, Bosick & Gordon LLP

(57) ABSTRACT

Composite materials comprising piezoelectric ceramic particulates dispersed in a metal matrix are capable of vibration damping. When the piezoelectric ceramic particulates are subjected to strain, such as the strain experienced during vibration of the material, they generate an electrical voltage that is converted into Joule heat in the surrounding metal matrix, thereby dissipating the vibrational energy. The piezoelectric ceramic particulates may also act as reinforcements to improve the mechanical properties of the composites. The composite materials may be used in various structural components in vehicles, aircraft, spacecraft, buildings and tools.

25 Claims, 9 Drawing Sheets $a_1 = a_2 = a_3$ $a_1 = a_2 < a_3$
$a_3 / a_1 = 5$ $a_1 = a_2 \gg a_3$
$a_3 / a_1 = 0.1$

US 7,126,257 B2

PIEZOELECTRIC CERAMIC-REINFORCED METAL MATRIX COMPOSITES

CROSS-REFERENCE TO RELATED APPLICATION

This application claims the benefit of U.S. Provisional Patent Application Ser. No. 60/472,742 filed May 23, 2003, which is incorporated herein by reference.

GOVERNMENT CONTRACT

The United States Government has certain rights to this invention pursuant to Contract No. DAA 19-01-1-0714 awarded by the U.S. Army Research Office.

FIELD OF THE INVENTION

The present invention relates to piezoelectric ceramic-reinforced metal matrix composite materials which are useful for structural applications, and which are capable of passively damping vibrations.

BACKGROUND INFORMATION

Structural materials and components that would benefit from vibration damping include automobile components, aircraft components, marine components, building components, hand tools, sports equipment, propulsion units, space structures, platforms and the like.

Many materials used in various structural applications possess relatively poor vibration damping characteristics. Vibration damping in structural high-load components is currently achieved through the use of external components such as elastomeric mounting materials or actively controlled vibration dampers. Vibration reduction is thus achieved through the use of damping materials and components that are often added on top of the existing structure.

The present invention has been developed in view of the foregoing.

SUMMARY OF THE INVENTION

The present invention provides a metal matrix composite material reinforced with discontinuous piezoelectric ceramic particulates which are dispersed in the metallic matrix. The inclusion of piezoelectric ceramic particulates allows the composite to exhibit exceptional passive damping capabilities while maintaining a high degree of structural strength. The composites provide passive vibration damping through the conversion of elastic strain to electrical energy to heat by resistive heating at the particulate/matrix interface, and/or by the reversal of the polarization vector of the piezoelectric domains in response to an applied stress. The present composite materials can be used in high load applications without the need for additional vibration damping materials. Additionally, the matrix is further strengthened through common dispersion strengthening mechanisms that involve the presence of effective obstacles to dislocation motion. Improved combinations of structural strength and vibration damping are achieved with the present materials.

An aspect of the present invention is to provide a composite material comprising a metal matrix and piezoelectric ceramic particulates dispersed in the metal matrix.

Another aspect of the present invention is to provide a vibration damping structural component comprising a composite material including a metal matrix and piezoelectric ceramic particulates dispersed in the metal matrix.

A further aspect of the present invention is to provide a method of making a vibration damping composite material by dispersing piezoelectric ceramic particulates in a metal matrix.

Another aspect of the present invention is to provide a method of damping vibrations in a structural component by forming at least part of the structural component from a composite material comprising a metal matrix and piezoelectric ceramic particulates dispersed therein.

These and other aspects of the present invention will be more apparent from the following description.

DETAILED DESCRIPTION

Figure 1:
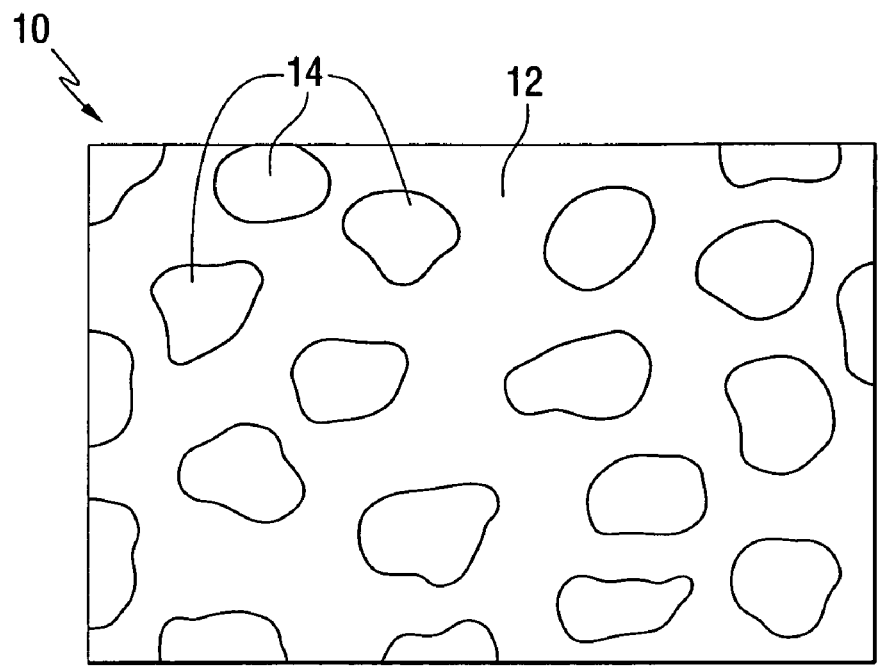
FIG. 1 is a partially schematic illustration of a composite material comprising a metal matrix with piezoelectric ceramic particulates dispersed therein in accordance with an embodiment of the present invention.
Figure 2:
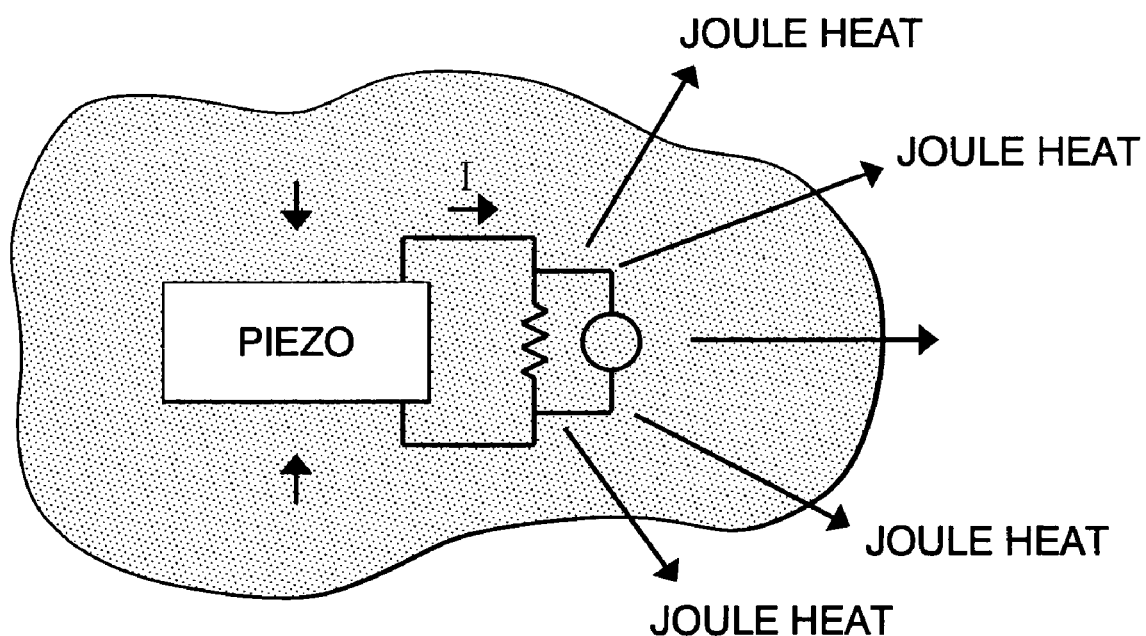
FIG. 2 schematically illustrates the generation of Joule heat from a piezoelectric ceramic particulate embedded in a metal matrix in accordance with an embodiment of the present invention.

FIG. 1 schematically illustrates a composite material 10 capable of damping vibrations in accordance with an embodiment of the present invention. The composite 10 comprises a metal matrix 12 and piezoelectric ceramic particulates 14 dispersed in the metal matrix 12. When vibrations occur in the composite 10, the piezoelectric particles 14 are strained. This induces a voltage at the interface between the metal matrix 12 and the particulates 14, which is transferred into Joule heat, as illustrated in FIG. 2. The composite 10 is thus able to transfer incoming vibrations into heat energy. The piezoelectric ceramic particulates 14 may also strengthen the metal matrix 12 through common dispersion strengthening mechanisms such as dislocation motion hindering.

Figure 3:
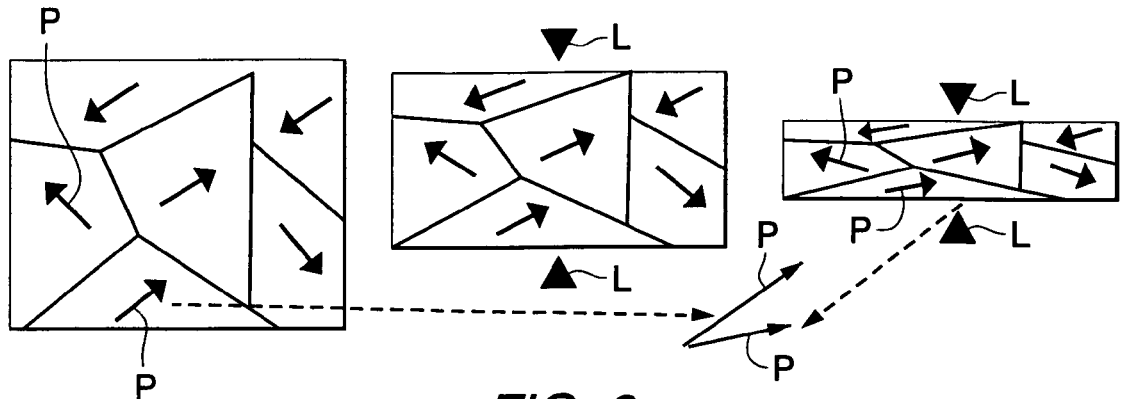
FIG. 3 schematically illustrates an alernative mechanism of energy dissipation by the presence of a piezoelectric ceramic particulate embedded in a metal matrix in accordance with another embodiment of the present invention in which reorientation of the polarization vector is responsible for the piezoelectric effect.

FIG. 3 schematically illustrates an alternative mechanism of vibration damping in a piezoelectric-reinforced composite in accordance with an embodiment of the present invention. Upon the application of load L, randomly-oriented polarization vectors P reorient themselves to maintain a zero-net aggregate polarization. The energy expended during reorientation of the polarization vectors P serves to enhance the damping capability of the composite material relative to the damping of the matrix alone.

Figure 4:
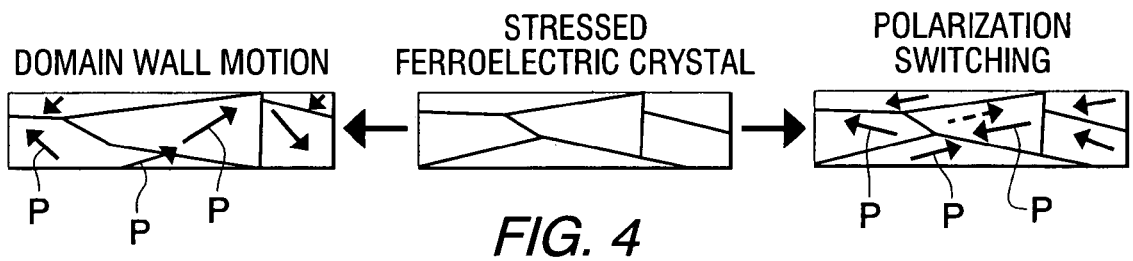
FIG. 4 schematically illustrates an alernative mechanism of energy dissipation by the presence of a piezoelectric ceramic particulate embedded in a metal matrix in accordance with another embodiment of the present invention in which reversal of the polarizaton vector is responsible for the piezoelectric effect.
Figure 5A:
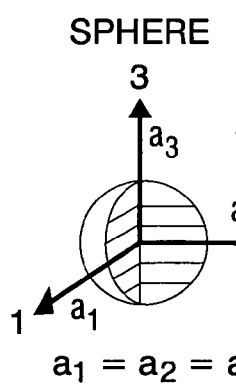
FIGS. 5a–5c illustrate spherical, spheroidal and disc shapes of piezoelectric ceramic particulates, respectively, in accordance with embodiments of the present invention.
Figure 5B:
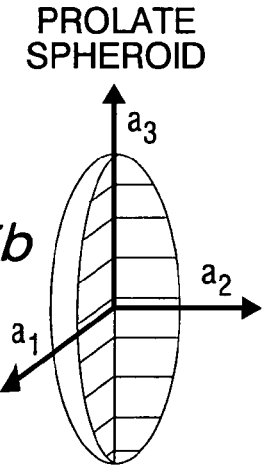
Figure 5C:
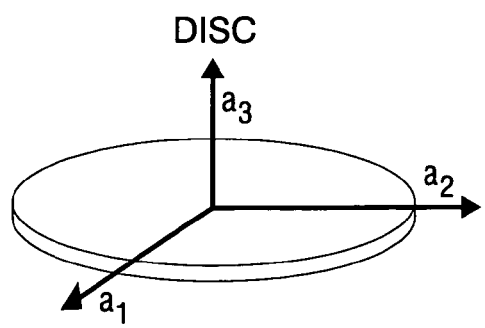

FIG. 4 schematically illustrates an alternative mechanism of vibration damping in a piezoelectric-reinforced composite in accordance with an embodiment of the present invention. Upon application of a load, the material experiences a strain which results in a shape or dimensional change. A zero-net aggregate polarization can be accomplished through reversal, or swithching of the polarization vector P of certain individual domains. The energy expended during polarization switching serves to enhance the damping capabilities of the composite material relative to the damping characteristics of the matrix alone.

As used herein, the terms "structural material" and "structural component" mean materials and components that are subjected to mechanical loading during use. Such mechanical loading may include vibration as well as compression, tension, bending, multiaxial loading, and the like.

As used herein, the term "metal matrix" means an interconnected or continuous network comprising at least one metal. The metal matrix may comprise a single metal, metal alloys and intermetallics. The metal matrix preferably has sufficient electrical conductivity and thermal conductivity to facilitate Joule heating when the embedded piezoelectric ceramic particulates are strained and produce electrical voltages. The metal matrix may have a thermal conductivity of at least 5 W/m·K. The metal matrix may also have suitable mechanical properties for use in structural applications, such as adequate strength, fracture toughness and fatigue resistance. For example, the metal matrix may have a yield strength of at least 20 MPa, and may have a fracture toughness of at least 8 MPa$\sqrt{m}$.

Some suitable matrix metals include Cu, Al, Fe, Pb, Mg, Ni, Ti, Co, Mo, Ta, Nb, W, Ni, Zn and Sn, and combinations thereof. Preferred matrix metals include Cu, Zn, Sn, Ti, Al, Fe, Ni and Co, and combinations thereof.

In one embodiment, the matrix metal has a relatively low sintering temperature in order to avoid damage to certain types of piezoelectric ceramic particulates. Matrix metal sintering temperatures below about 850° C. may be preferred, e.g., below 800 or 700° C., depending on the type of piezoelectric ceramic dispersed in the metal matrix. The matrix metal may also have a relatively low melting temperature for some applications. For example, melting temperatures below about 1,000° C., e.g., below 900 or 800° C. may be preferred for the matrix metal.

The matrix metal typically comprises from about 35 to about 95 volume percent of the composite material, for example, from about 50 to about 80 volume percent of the composite material.

As used herein, the term "piezoelectric ceramic" means a material which produces an electrical voltage when subjected to strain caused by vibrations, acoustical energy, compression, tension, bending, multiaxial loading and the like. The piezoelectric ceramic may comprise any suitable composition which produces the desired vibration damping effect when dispersed in a metal matrix, and which does not react with the matrix metal to an undesirable extent.

Some suitable piezoelectric ceramics for use in accordance with the present invention include $AgNbO_3$, $AgTaO_3$, AlN, $BaTiO_3$, $(Ba,Ca)TiO_3$, $Ba_{0.4}Na_{0.2}NbO_3$, $BaNb_2O_6$, $(Ba,Pb)TiO_3$, $(Ba,Sr)Nb_2O_6$, $(Ba,Sr)TiO_3$, $Ba(Ti,Zr)O_3$, $(Ba_{0.777}Ca_{0.133}Pb_{0.090})TiO_3$, BeO, $Bi_3TiNbO_9$, $Bi_3TiTaO_9$, $Bi_4Ti_3O_{12}$, $Bi_5Ti_3GaO_{15}$, $Bi_5Ti_3FeO_{15}$, $Bi_2PbNb_2O_{9Bi2}PbTa_2O_9$, $Bi_3PbTi_2NbO_{12}$, $Bi_4PbTi_4O_{15}$, $Bi_4Pb_2Ti_5O_{18}$, $Bi_2CaNb_2O_9$, $Bi_2CaTa_2O_9$, $Bi_4CaTi_4O_{15}$, $Bi_2SrNb_2O_9$, $Bi_2SrTa_2O_9$, $Bi_4SrTi_4O_{15}$, $Bi_4Sr_2Ti_5O_{18}$, $Bi_2BaNb_2O_9$, $Bi_2BaTa_2O_9$, $Bi_3BaTi_2NbO_{12}$, $Bi_4BaTi_4O_{15}$, $Bi_4Ba_2Ti_5O_{18}$, $Bi_{4.5}Na_{0.5}Ti_4O_{15}$, $Bi(Na,K)Ti_2O_6$, $Bi_{4.5}K_{0.5}Ti_4O_{15}$, $BiFeO_3$, $Bi_{12}GeO_{20}$, CdS, CdSe, CdTe, $C_2H_4(NH_3)_2(C_4H_4O_6)$, $(CH_2CF_2)_n$, $C_6H_{14}N_2O_6$, $Cd_2Nb_2O_7$, CuCl, GaAs, $K_2C_4H_4O_{6\text{-}0.5}H_2O$, $KH_2PO_4$, $(K,Na)NbO_3$, $KNbO_3$, $K(Nb,Ta)O_3$, $LiGaO_2$, $LiNbO_3$, $LiTaO_3$, $LiIO_3$, $(Na_{0.5}K_{0.5})NbO_3$, (hot pressed), (Na,Ca)(Mg,Fe,Al,Li), $3Al_6\text{-}(BO_3)_3(Si_6O_{18})(OH,F)_4$, (Na,Cd)$NbO_3$, $NaNbO_3$, $Na(Nb,Ta)O_3$, $(Na,Pb)NbO_3$, $Na_{0.5}Bi_{4.5}TiO_{15}$, $NaKC_4H_4O_{6\text{-}4}H_2O$, $NH_4H_2PO_4$, $ND_4D_2PO_4$, $Pb_{0.925}La_{0.05}Zr_{0.56}Ti_{0.44}O_3$, $(Pb_{0.58}Ba_{0.42})Nb_2O_6$, $(Pb,Ba)(Ti,Sn)O_3$, $(Pb,Ba)(Ti,Zr)O_3$, $(Pb_{0.76}Ca_{0.24})[Co_{1/2}W_{1/2}]_{0.04}Ti_{0.96}]O_3+2$ mol % MnO, $PbHfO_{3\text{-}0.65}Pb(Mg_{1/3}Nb_{2/3})O_{3\text{-}0.35}PbTiO_3$, $PbNb_2O_6$, $Pb(Nb,Ta)_2O_6$, $PbSnO_3$, $(Pb,Sr)Nb_2O_6$, $(Pb,Sr)(Ti,Zr)O_3$, $PbTiO_3$, $PbTiO_3\text{-}BiFeO_3$, $PbTiO_3\text{-}Pb(Fe_{0.5}Nb_{0.5})O_3$, $PbTiO_3\text{-}Pb(Mg_{1/3}Nb_{2/3})O_3$, $PbTiO_3\text{-}Pb(Zn_{1/3}Nb_{2/3})O_3$, $Pb(Ti,Sn)O_3$, $Pb(Ti,Zr)O_3\text{-}Pb(Ti,Zr)O_3$, $Pb(Fe_{0.5},Nb_{0.5})O_3\text{-}Pb(Ti,Zr)O_3\text{-}Pb(Mg_{1/3}Nb_{2/3})O_3$, $Pb(Ti,Zr)O_3\text{-}Pb(Ni_{1/3}Nb_{2/3})O_3$, $Pb(Ti,Zr)O_3$, $Pb(Ti,Zr,Sn)O_3$, $PbZrO_3$, $PbZrO_3\text{-}BaZrO_3$, $Pb(Zr,Sn,Ti)O_3$, g-Se, a-$SiO_2$, $SrBi_4TiO_{15}$, $Sr_2Ta_2O_7$, $SrTiO_3$, $WO_3$, ZnO, b-ZnS, ZnSe, ZnTc.

One group of piezoelectric ceramics suitable for use in accordance with the present invention includes oxides of metals selected from Ba, Sr, Ca, Pb, Ti, Zr, Mg, La and/or Nb. For example, the piezoelectric ceramics may comprise $Pb(Mg_{1/3}Nb_{2/3})O_3$ (PMN) or metal titanates such as $BaTiO_3$, $PbTiO_3$, $Pb(Ti,Zr)O_3$ (PZT) and/or $Pb(La,Ti,Zr)O_3$ (PLZT), with $BaTiO_3$ and $PbTiO_3$ being particularly suitable piezoelectric ceramics. Metal oxides such as ZnO and $SiO_2$ may also be suitable.

The piezoelectric ceramic is provided in the form of particulates which may have any desired shape such as equiaxed, elongated, plate, rod, fiber, and ellipsoidal shapes. FIGS. 3a, 3b and 3c illustrate spherical, spheroidal and disc-shaped particulates, respectively. The particles are preferably discontinuous and are dispersed in the metal matrix. The particles may have any desired size, for example, average diameters of from about 0.5 microns to about 2 mm may be suitable, typically from about 0.5 microns to about 100 microns. Disc-shaped reinforcements may provide high levels of Joule heating. Reinforcement geometries that favor high load transfer from the matrix to the reinforcement (aspect ratios less or greater than one) will lead to higher electric fields and thus higher damping potential as predicted by this model.

The piezoelectric ceramic particulates typically comprise from about 5 to about 65 volume percent of the composite, typically from about 20 to about 50 volume percent. Each piezoelectric ceramic particulate may comprise a single crystal, or may comprise multiple crystals or grains. The piezoelectric particles can be randomly dispersed and oriented within metal matrix with respect to any reference direction. Within each individual piezoelectric particle, the polarization vectors can be initially randomly oriented, or the polarization vectors may be mutually oriented by poling prior to their dispersion within the metal matrix. Orientation of the piezoelectric domains among all piezoelectric particles with respect to a reference direction will also produce the enhanced benefits. Thus, the piezoelectric ceramic particulates may have polarization vectors that are randomly oriented in each particulate. Alternatively, the particulates may have polarization vectors that are partially or fully aligned within each particulate. In one embodiment, within the metal matrix, the piezoelectric ceramic particulates are randomly oriented with respect to the matrix. In another embodiment, the polarization vectors among the piezoelectric ceramic particulates are at least partially aligned with respect to the composite, i.e., the polarization vectors are oriented in a common orientation with respect to a reference direction of the composite.

The piezoelectric ceramic particulates possess a sufficiently high piezoelectric coefficient, v, which may be greater than $2 \times 10-12$ V·m−1. The piezoelectric ceramic particulates have an electromechanical coupling factor, k, which is preferably greater than 0.1. The present composite materials possess favorable vibration damping, e.g., a vibration damping loss coefficient of greater than $1 \times 10^{-4}$. For example loss coefficients (tan Δ) of greater than 0.01 may be achieved, typically greater than 0.1.

The composite materials may be formed by densifying techniques following processes such as conventional blending, solvent-mediated reaction synthesis (SMRS) and mechanical alloying (MA). SMRS is performed by formulating and blending precursor constituents of the nominal composite formulation desired. If thermodynamically favorable, a synthesis reaction can be initiated, e.g., using an induction power heating source. The as-synthesized product may be crushed to ensure homogeneity, and subsequently densified using powder metallurgy techniques such as sintering, hot isostatic pressing or hot pressing. Mechanical alloying is performed by formulating and ball milling precursor constituents of the desired nominal composite formulation. The milling provides energy to initiate the synthesis reaction. The as-synthesized product is densified using powder metallurgy techniques such as sintering, hot isostatic pressing or hot pressing. If produced using a solvent-mediated, in situ reaction synthesis technique, such a composite may derive benefit from certain microstructural attributes known to be characteristic of the process, notably, clean matrix-particle interfaces, single crystal reinforcement, and a broad ability to vary reinforcement size and volume fraction.

The following examples are intended to illustrate various aspects of the present invention, and are not intended to limit the scope of the inventions.

EXAMPLE 1

Figure 6:
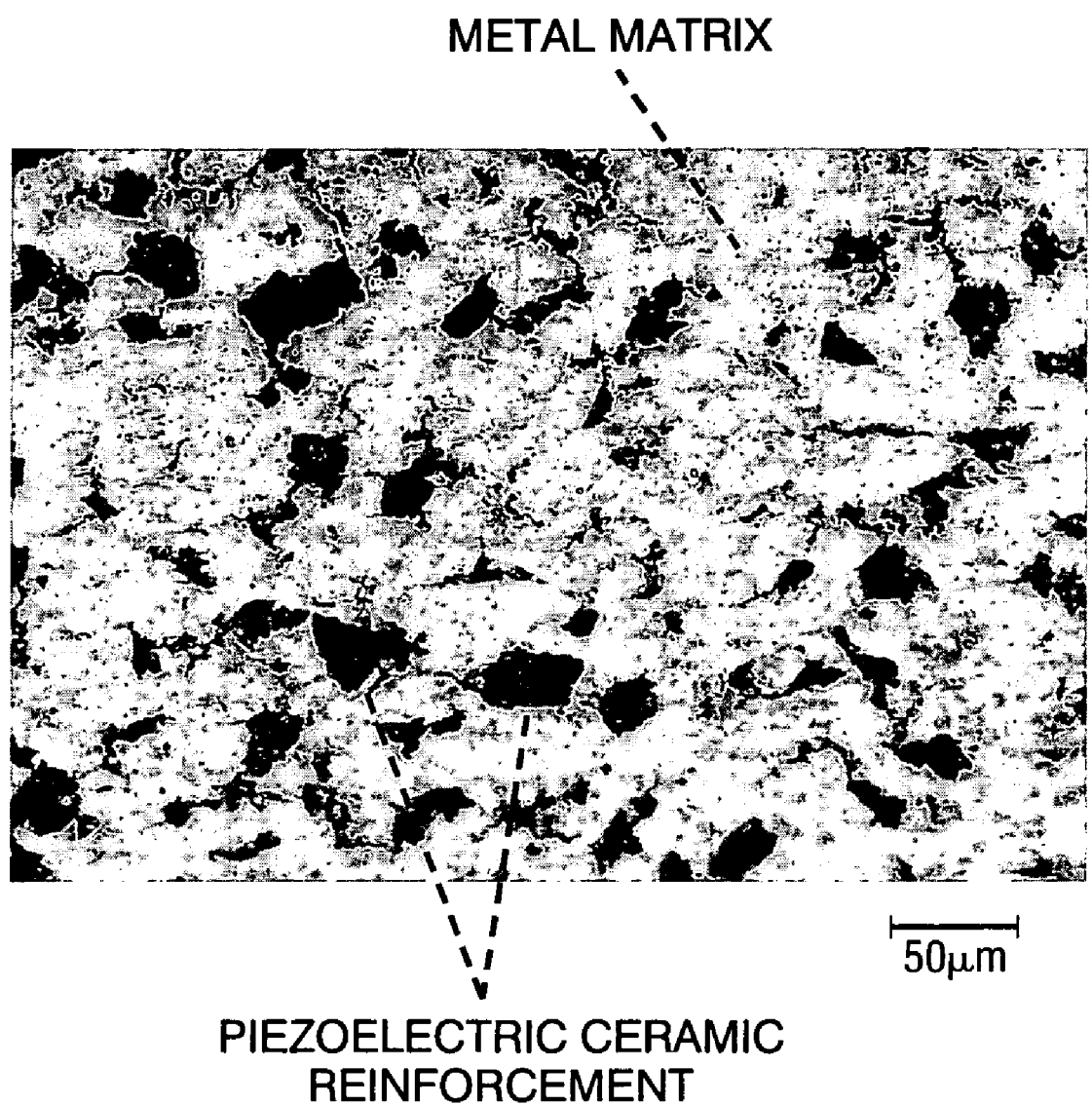
FIG. 6 is a photomicrograph of a composite material comprising a copper-tin alloy metal matrix and barium titanate ($BaTiO_3$) piezoelectric ceramic particulates dispersed therein.

A composite was made by blending Cu, Sn and $BaTiO_3$, followed by liquid phase sintering at 820° C. for 6 minutes. FIG. 6 is a photomicrograph of the resultant composite material.

EXAMPLE 2

Figure 7:
FIG. 7 is a photomicrograph of a composite material comprising a nickel-chrome alloy metal matrix and $BaTiO_3$ piezoelectric ceramic particulates dispersed therein.

A composite was made by blending 61.5 w % Ni, 15.4 w % Cr and 22.5w % $BaTiO_3$, mechanical alloying for 24 h, and heat treating at 600° C. for 5 h in argon. The resulting metal matrix composite had a composition of (Ni–20w % Cr)+30v % $BaTiO_3$. FIG. 7 is a photomicrograph of the composite material.

EXAMPLE 3

Figure 8:
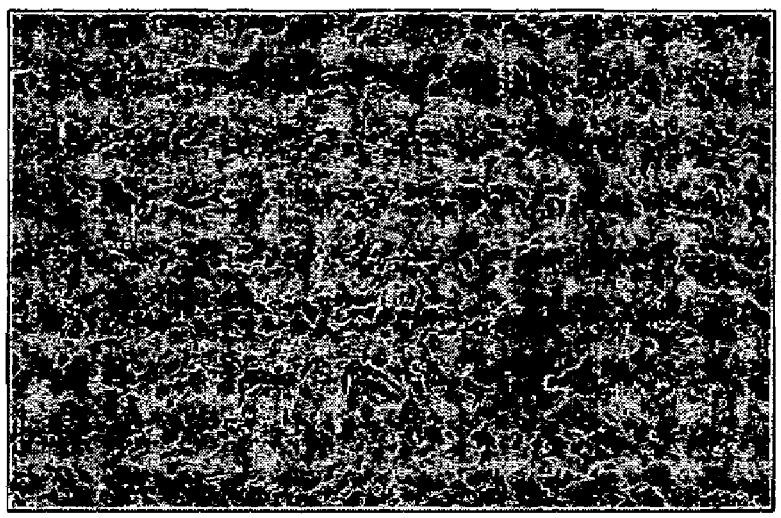
FIG. 8 is a photomicrograph of a composite material comprising a nominally-pure copper metal matrix and zinc oxide (ZnO) piezoelectric ceramic particulates dispersed therein.

Synthesis of a binary piezoelectric compound, ZnO, directly within copper and iron matrices was conducted. Blends of elemental or compound powder precursors were formulated in proportions appropriate to create composites comprised of 20, 25, 30, 40 and 50 volume percent ZnO in copper; and 30, 40, 50 and 60 volume percent ZnO in iron. FIG. 8 is a photomicrograph of the Cu+30 v % ZnO composite material after reaction synthesis.

The precursor reactants and the intended synthesis reactions assumed to occur were:

$$(1+x)Cu + Cu_2O + Zn \rightarrow (3+x)Cu + ZnO \tag{1}$$

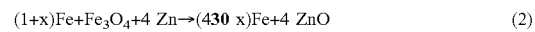

$$(1+x)Fe + Fe_3O_4 + 4\ Zn \rightarrow (430\ x)Fe + 4\ ZnO \tag{2}$$

In reactions (1) and (2), additional Cu or Fe is added in a proportion appropriate to create the desired composite composition. The blended powders were cold-compacted and reactively synthesized within flowing argon. The synthesis event was initiated within an induction furnace, and proceeded in a self-sustaining fashion to completion.

Following synthesis, the as-reacted sponge was characterized metallographically using scanning electroc microscopy in backscattered electron (BSE) mode. Phase constituency was determined via X-ray diffraction. In the latter instance, a Rietveld quantitative analysis technique was applied to the Cu—ZnO system in an attempt to assess the actual phase proportions created during synthesis. Energy dispersive spectroscopy (EDS) was used to assist in the association of microstructure to specific phases.

Measurable quantities of $Cu_2O$ are present within the composites containing 20, 25 and 30 v % ZnO, but not at the higher percentages. CuO is observed in the Cu+50 v % ZnO formulation. The presence of $Cu_2O$ suggests that the reaction, as indicated in Eq. 1, did not proceed to completion. The presence of CuO suggests potential oxygen contamination during the synthesis reaction.

Similar microstructures were observed for the Fe—ZnO composite system, that is, a relatively inhomogeneous microstructure comprised of regions of pure Fe, or regions comprised of a mixture of Fe and ZnO. FeO was also identified using EDS. X-ray diffraction confirms the presence of Fe, ZnO and FeO.

A numerical model based on the Eshelby equivalent inclusion method has been developed as a means to gauge the energy absorption (damping) capability of piezoelectric-reinforced metal matrix composites. The model computes the Joule heating generated within a variety of metallic matrices as a consequence of the mechanical excitation of various randomly dispersed piezoelectric reinforcement formulations. The model predicts that enhanced damping performance by such a mechanism would, in general, be realized for highly conductive metallic matrices containing reinforcements with high piezoelectric capability.

The model is based on Eshelby's equivalent inclusion technique. The Eshelby analysis provides a mechanics-based approach to compute the average stress within an inhomogeneous inclusion or reinforcement. This information can subsequently be coupled with known piezoelectric constants to compute the electric field generated within an electrically-isolated crystal due to an applied mechanical stress state. By its actual presence within the metallic matrix, the electric field will not be sustained. However, if a current is assumed to resistively dissipate into the metallic matrix, Joule heat will result.

The average Eshelby stress generated within a mechanically-inhomogeneous inclusion is $$\bar{\sigma}_I = \sigma_A + \langle \sigma \rangle_I \quad (3)$$

where $\sigma_A$ is the applied stress stage (tensor) and $\langle \sigma \rangle_I$ is the mean internal stress in the inclusion. The latter is computed for a volume fraction of reinforcement, f, from $$\langle \sigma \rangle_I = (1-f) \cdot C_M \cdot (S-I) \cdot \epsilon^T \quad (4)$$

where $C_M$ is the matrix stiffness tensor, S is the Eshelby shape tensor, and $\epsilon^T$ is the Eshelby transformation strain. The Eshelby shape tensor is computed for several common shapes and provides a means to examine the mechanical implications of disc- or sphere-shaped reinforcements in the present study.

An average electric field, E(I), generated in the piezoelectric can thus be computed according to $$E(I) = g(I) \cdot \bar{\sigma}_I \quad (5)$$

where g(I) is the orientation-dependent piezoelectric voltage tensor in units of Vm/N. To account for the random orientation of the dispersion of anisotropic piezoelectric crystals within a discontinuously-reinforced (DR) composite, the model analyzes a user-defined number, n, of orientation sets from which a transformed g(I) tensor is obtained. All possible crystal orientations are thus considered through use of a root-mean-squared value of the electric field:

$$E_{rms} = \sqrt{\frac{\sum_{1}^{n} E(I)^2}{n}} \quad (6)$$

An estimate of the heat generated, Q (J/s), as a consequence of the field short can finally be computed for a given volume of reinforcement $V_1$:

$$Q = k_c \cdot E_{rms}^2 \cdot V_1 \quad (7)$$

where $k_c$ is the electrical conductivity tensor for the metallic matrix. Computations were conducted for three piezoelectric crystals (of increasing piezoelectric strength)—ZnO, $BaTiO_3$, and $PbTiO_3$, each within five example matrices (Al, Cu, Fe, Ni and Ti) of varying mechanical and electrical properties. Elastic compliance, piezoelectric voltage tensors, and conductivity data for these materials were obtained.

Figure 9:
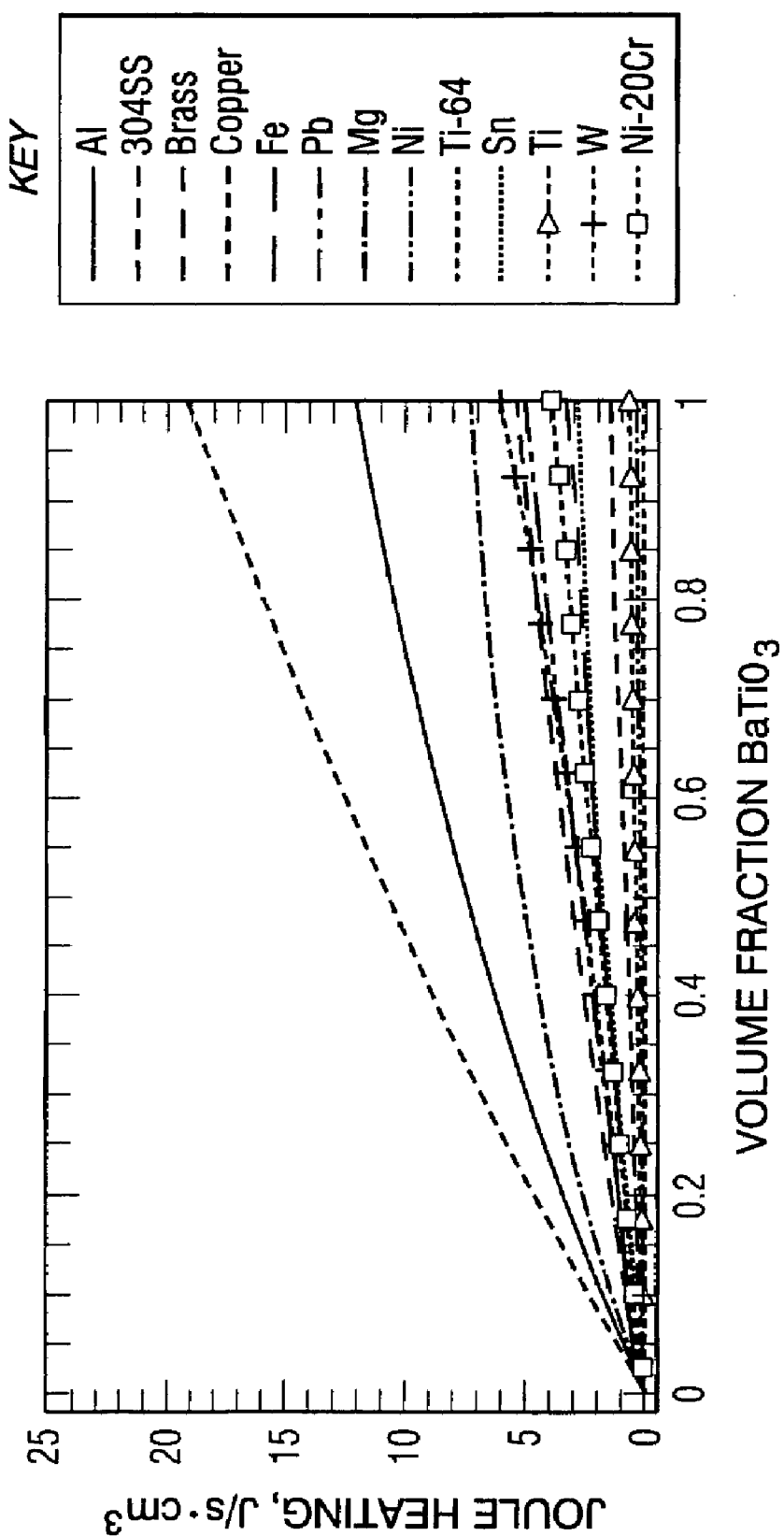
FIG. 9 is a graph of predicted Joule heating versus volume fraction of $BaTiO_3$ for a total volume of 1 cubic centimeter of composite materials comprising various metal matrices.
Figure 10:
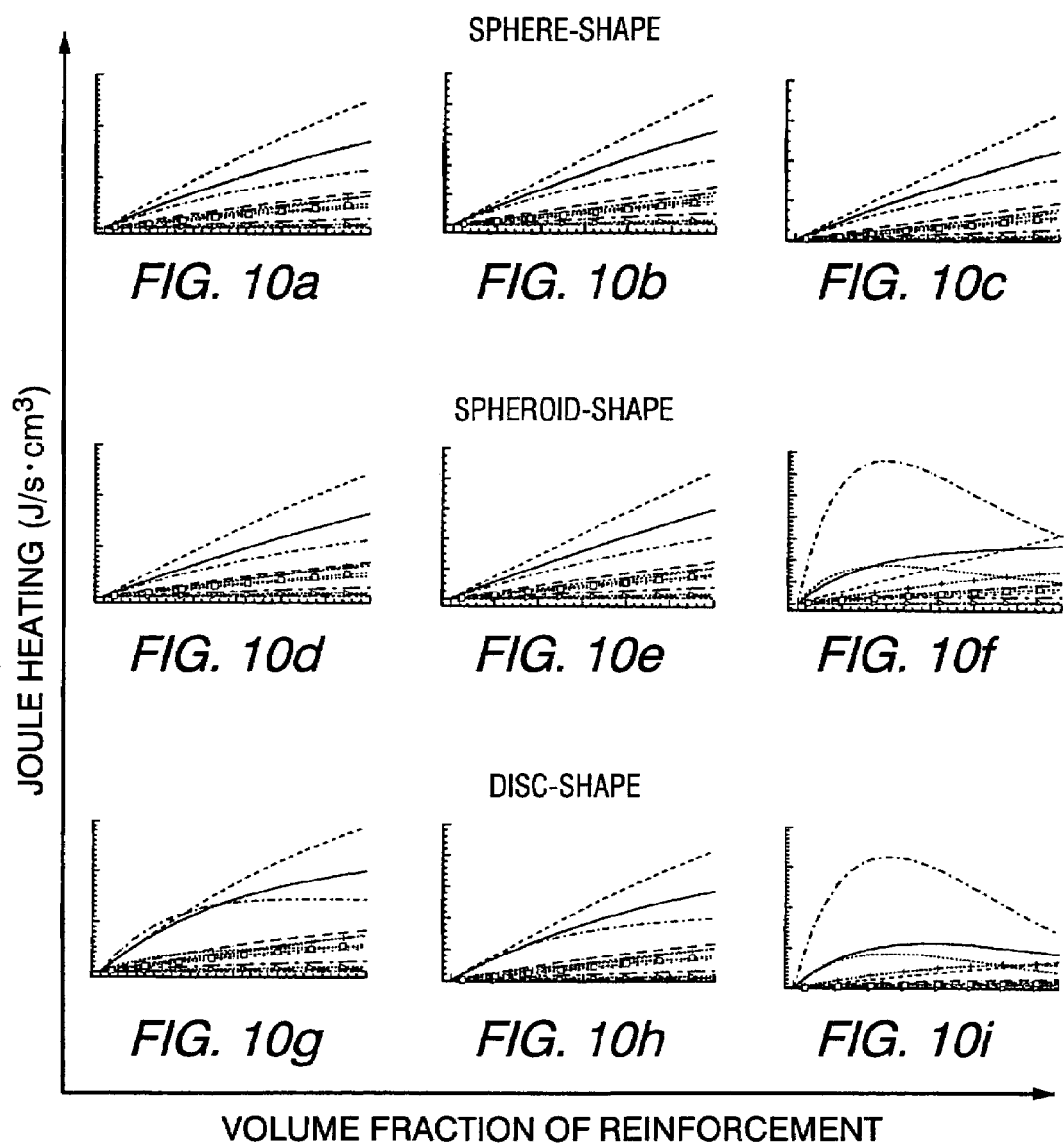
FIGS. 10a–10i are graphs of predicted Joule heating versus volume fraction of $BaTiO_3$, $PbTiO_3$ and ZnO piezoelectric particulates having spherical, spheroidal and disc shapes dispersed in various metal matrices in accordance with embodiments of the present invention.

FIG. 9 illustrates a semiquantitative estimate of the degree of Joule heating as a function of volume percentage $BaTiO_3$ within thirteen different metallic matrices, for a total composite volume of 1 $m^3$. As shown, damping performance is predicted to increase with percentage of piezoelectric-reinforcement. Damping improvements are also predicted for metallic matrices which have high thermal conductivity values.

FIGS. 10a–10i show example output of the model for three different reinforcement shapes and a variety of piezoelectric reinforcements, reinforcement shapes, and metallic matrix combinations. These figures exhibit the same type of data shown for FIG. 9, but for 1 $cm^3$ of total composite volume. Lead titanate ($PbTiO_3$) reinforcements are predicted to generate the most Joule heating, followed by $BaTiO_3$ and ZnO. This trend is a direct result of the magnitudes of the piezoelectric voltage tensor.

Interesting behavior is noted for disc-shaped ZnO reinforcement of Al. A peak in damping capability occurs at a reinforcement volume fraction of approximately 0.25. This can be correlated to a maximum in load transfer from the matrix to the high aspect ratio reinforcement. The Al matrix is significantly strengthened by the addition of ZnO which has an elastic modulus considerably greater than that of Al. Aluminum additionally has a high conductivity value which will also positively contribute to the predictions. However, as the volume percentage increases, per-inclusion stress begins to decrease resulting in a net decrease of Joule heating.

Figure 11:
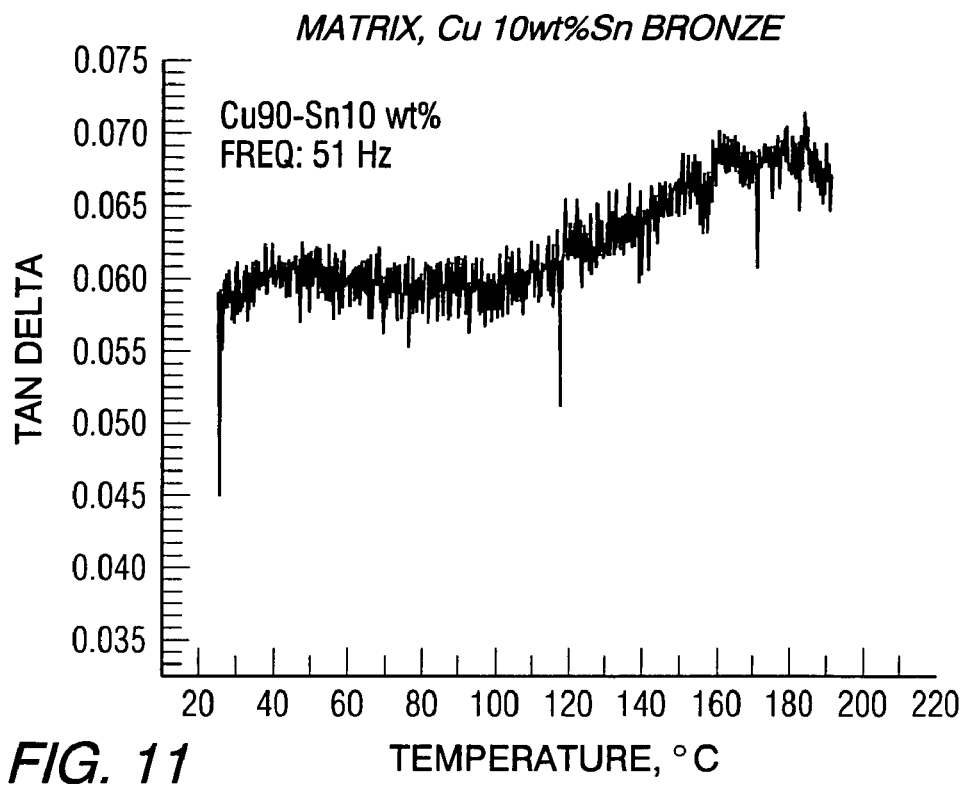
FIG. 11 is a graph illustrating increased vibration damping with increased temperature for a Cu—Sn metal matrix material.
Figure 12:
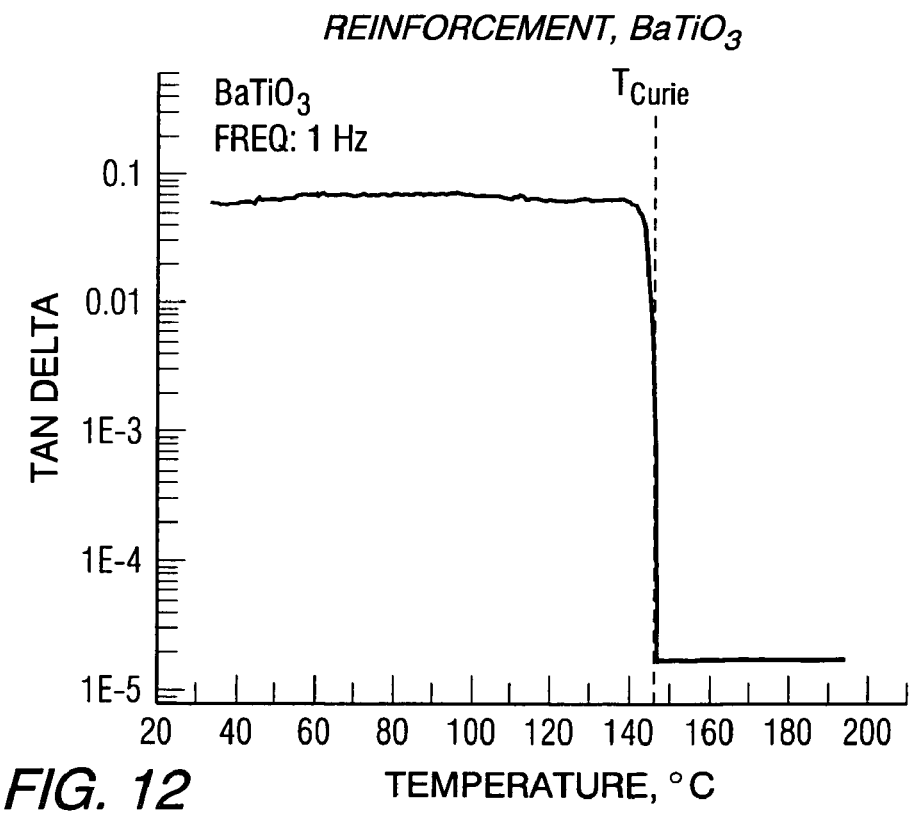
FIG. 12 is a graph illustrating vibration damping characteristics for a $BaTiO_3$ piezoelectric ceramic material below and above its Curie temperature.
Figure 13:
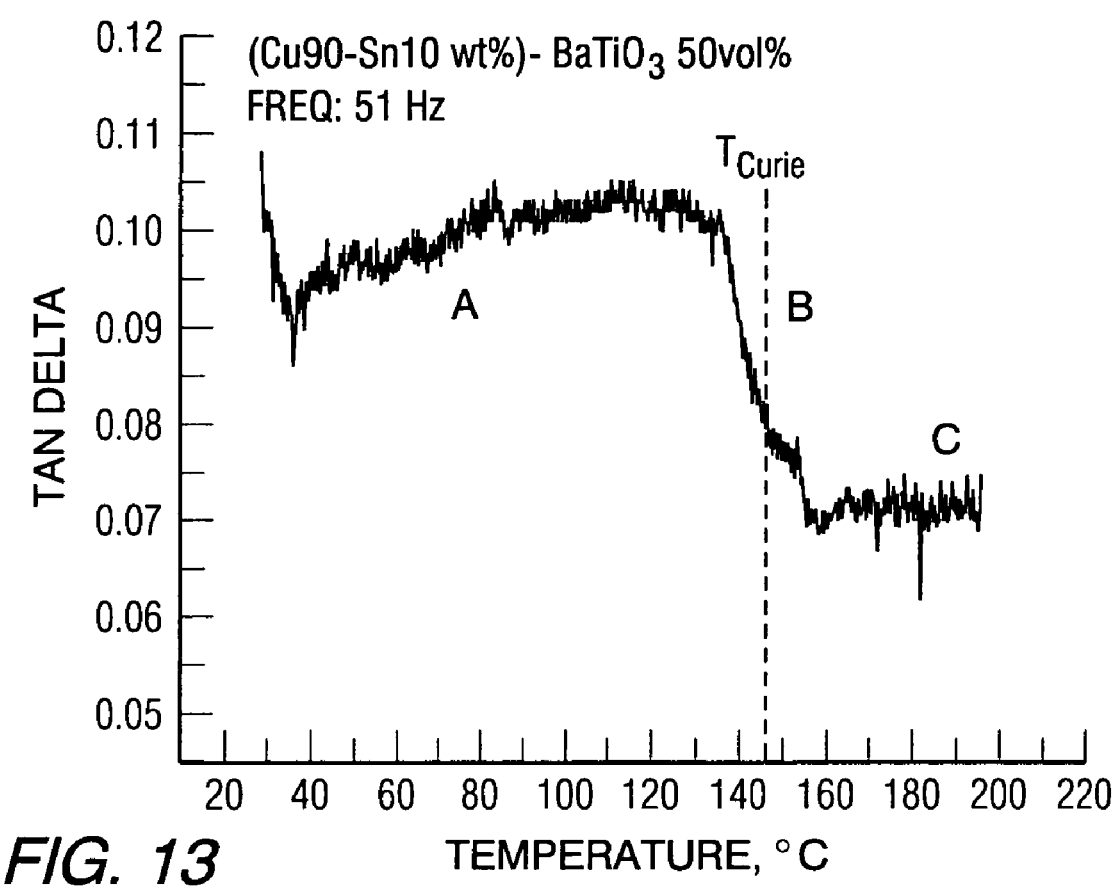
FIG. 13 is a graph illustrating vibration damping characteristics for a composite material comprising a Cu—Sn metal matrix with 50 volume percent $BaTiO_3$ piezoelectric ceramic particulates dispersed therein, showing an increase in vibration damping ability below the Curie temperature of the $BaTiO_3$ reinforcements.

FIGS. 11, 12 and 13 illustrate loss coeffient, a measurement of the damping capability, as a function of temperature for a monolithic metallic alloy (FIG. 11), monolithic $BaTiO_3$ (FIG. 12), and a composite comprised of a 50—50 volume percentage blend of the two (FIG. 13).

The present composite materials can be used in any applications where strength and damping are important system requirements. A great flexibility in synthesis routes and processing allows for a high degree of composite system design. Through variances in reaction system stoichiometry and chemistry, these composites can be tailored to meet a great number of performance criteria including corrosion, fatigue, and creep resistance, and mechanical property levels such as high hardness, stiffness, and yield strengths. Numerous potential applications thus exist that will only fully be realized when design problems present themselves and material systems are created to solve them. Examples might include numerous individual components on vehicles (aircraft, automobile, military, marine), marine propellers, building materials, etc.

Whereas particular embodiments of this invention have been described above for purposes of illustration, it will be evident to those skilled in the art that numerous variations of the details of the present invention may be made without departing from the invention as defined in the appended claims.

The invention claimed is:

1. A method of damping vibrations in a structural component comprising forming at least a part of the structural component from a composite material comprising a metal matrix and piezoelectric ceramic particulates in the metal matrix.

2. The method of claim 1, wherein the piezoelectric ceramic particulates comprise at least one oxide of a metal comprising Ba, Sr, Ca, Pb, Ti, Zr and/or Nb.

3. The method of claim 1, wherein the piezoelectric ceramic particulates comprise $BaTiO_3$, ZnO, $PbTiO_3$, $Pb(Ti,Zr)O_3$, $Pb(Mg_{1/3}Nb_{2/3})O_3$ and/or $Pb(La,Ti,Zr)O_3$.

4. The method of claim 1, wherein the piezoelectric ceramic particulates comprise $BaTiO_3$.

5. The method of claim 1, wherein the piezoelectric ceramic particulates comprise from about 5 to about 65 volume percent of the composite.

6. The method of claim 1, wherein the piezoelectric ceramic particulates comprise from about 20 to about 50 volume percent of the composite.

7. The method of claim 1, wherein the piezoelectric ceramic particulates are substantially equiaxed.

8. The method of claim 1, wherein the piezoelectric ceramic particulates are substantially elongated.

9. The method of claim 1, wherein the piezoelectric ceramic particulates are substantially disc shaped.

10. The method of claim 1, wherein the piezoelectric ceramic particulates have an average particle size of from about 0.5 microns to about 2 mm.

11. The method of claim 1, wherein the piezoelectric ceramic particulates have an average particle size of from about 0.5 microns to about 100 microns.

12. The method of claim 1, wherein the piezoelectric ceramic particulates have a piezoelectric coefficient, d, greater than $2 \times 10^{-12}$ V·m−1.

13. The method of claim 1, wherein the piezoelectric ceramic particulates have an electromechanical coupling factor, k, greater than 0.1.

14. The method of claim 1, wherein the metal matrix comprises Cu, Al, Fe, Pb, Mg, Ni, Ti, Co, Mo, Ta, Nb, W, Ni and/or Sn.

15. The method of claim 1, wherein the metal matrix comprises Cu, Sn, Ti, Al, Fe, Ni and/or Co.

16. The method of claim 1, wherein the metal matrix comprises from about 35 to about 95 volume percent of the composite.

17. The method of claim 1, wherein the metal matrix comprises from about 50 to about 80 volume percent of the composite.

18. The method of claim 1, wherein the metal matrix has a thermal conductivity of at least 5 W/m·K.

19. The method of claim 1, wherein the metal matrix has a yield strength of at least 20 MPa.

20. The method of claim 1, wherein the metal matrix has a fracture toughness of at least 8 MPa√m.

21. The method of claim 1, wherein the composite material has a vibration damping loss coefficient of greater than $1 \times 10^{-4}$.

22. The method of claim 1, wherein the piezoelectric ceramic particulates have polarization vectors that are randomly oriented in each particulate.

23. The method of claim 1, wherein the piezoelectric ceramic particulates have polarization vectors that are at least partially aligned within each particulate.

24. The method of claim 23, wherein the piezoelectric ceramic particulates are randomly oriented within the metal matrix.

25. The method of claim 23, wherein the polarization vectors of the piezoelectric ceramic particulates are at least partially aligned with respect to the composite.

* * * * *

UNITED STATES PATENT AND TRADEMARK OFFICE
CERTIFICATE OF CORRECTION

PATENT NO. : 7,126,257 B2
APPLICATION NO. : 10/851022
DATED : October 24, 2006
INVENTOR(S) : Stephen L. Kampe et al.

It is certified that error appears in the above-identified patent and that said Letters Patent is hereby corrected as shown below:

Column 4, Line 25
"$Bi_2PbNb_2O_{9Bi2}PbTa_2O_9$" should read -- $Bi_2PbNb_2O_9$, $Bi_2PbTa_2O_9$ --

Column 4, Line 45
"$Pb(Fe_{0.5},Nb_{0.5})O_3-Pb(Ti,Zr)O_3-Pb(Mg1/3Nb2/3)O_3$" should read -- $Pb(Fe_{0.5},Nb_{0.5})O_3$, $Pb(Ti,Zr)O_3-Pb(Mg1/3Nb2/3)O_3$ --

Column 5, Line 39
Used small delta (tan δ) instead of capital delta (tan Δ)

Column 6, Line 31
"$(1+x)Fe+Fe_3O_4+4\ Zn \rightarrow (430\ x)\ Fe+4\ ZnO$" should read -- $(1+x)Fe+Fe_3O_4+4\ Zn \rightarrow (4+x)\ Fe+4\ ZnO$ --

Signed and Sealed this

Third Day of April, 2007

JON W. DUDAS
*Director of the United States Patent and Trademark Office*